(12) United States Patent  (10) Patent No.: US 7,670,962 B2
Huemoeller et al.  (45) Date of Patent: Mar. 2, 2010

(54) SUBSTRATE HAVING STIFFENER FABRICATION METHOD

(75) Inventors: Ronald Patrick Huemoeller, Chandler, AZ (US); Sukianto Rusli, Phoenix, AZ (US); David Jon Hiner, Chandler, AZ (US)

(73) Assignee: Amkor Technology, Inc., Chandler, AZ (US)

( * ) Notice: Subject to any disclaimer, the term of this patent is extended or adjusted under 35 U.S.C. 154(b) by 345 days.

(21) Appl. No.: 11/903,002

(22) Filed: Sep. 19, 2007

(65) Prior Publication Data

US 2008/0020132 A1 Jan. 24, 2008

Related U.S. Application Data

(60) Division of application No. 11/189,593, filed on Jul. 26, 2005, now abandoned, which is a continuation-in-part of application No. 11/166,005, filed on Jun. 24, 2005, now Pat. No. 7,297,562, which is a continuation-in-part of application No. 10/138,225, filed on May 1, 2002, now Pat. No. 6,930,256, and a continuation-in-part of application No. 11/045,402, filed on Jan. 28, 2005, now abandoned, which is a continuation-in-part of application No. 10/138,225.

(51) Int. Cl.
H01L 21/00 (2006.01)
H01L 21/31 (2006.01)
H01L 21/469 (2006.01)

(52) U.S. Cl. .................. 438/771; 438/110; 438/121; 438/463; 257/E21.347; 257/E21.475

(58) Field of Classification Search ................ 438/110, 438/121, 463, 771; 257/E21.347, E21.475
See application file for complete search history.

(56) References Cited

U.S. PATENT DOCUMENTS 3,324,014 A 6/1967 Modjeska ............. 205/122
3,778,900 A 12/1973 Haining et al. ............. 29/628
3,868,724 A 2/1975 Perrino ..................... 357/65
3,916,434 A 10/1975 Garboushian ............... 357/74
4,322,778 A 3/1982 Barbour et al. ............. 361/414

(Continued)

FOREIGN PATENT DOCUMENTS

| JP | 05-109975 | 4/1993 |
| JP | 05-136323 | 6/1993 |
| JP | 07-017175 | 1/1995 |
| JP | 08-190615 | 7/1996 |
| JP | 10-334205 | 12/1998 |

OTHER PUBLICATIONS

Huemoeller et al., "Semiconductor Package Having Laser-Embedded Terminals", U.S. Appl. No. 11/182,985, filed Jul. 14, 2005.

(Continued)

*Primary Examiner*—Alexander G Ghyka
*Assistant Examiner*—Seahvosh J Nikmanesh
(74) *Attorney, Agent, or Firm*—Gunnison, McKay & Hodgson, L.L.P.; Serge J. Hodgson

(57) ABSTRACT

An integral plated semiconductor package substrate stiffener provides a low-cost and space-efficient mechanism for maintaining substrate planarity during the manufacturing process. By patterning and plating the stiffener along with the other substrate fabrication process steps, the difficulty of attaching a separate stiffener is averted. Also, the stiffener pattern can be provided around other substrate elements such as the circuit patterns and terminals, while maintaining requisite spacing. The stiffener is a two-layer metal structure, the first layer is a thin film metal layer on which a thicker outer metal layer is plated up. The two metal layers may be of different metals or alloys and the thin film metal layer may be the same layer plane that provides one of the substrate interconnect layers or may be the metal layer removed from other areas of the substrate during isolation of an embedded circuit layer.

25 Claims, 7 Drawing Sheets

U.S. PATENT DOCUMENTS

| | | | |
|---|---|---|---|
| 4,508,754 A | 4/1985 | Stepan | 427/53.1 |
| 4,532,152 A | 7/1985 | Elarde | 427/96 |
| 4,532,419 A | 7/1985 | Takeda | 235/492 |
| 4,604,799 A | 8/1986 | Gurol | 29/847 |
| 4,642,160 A | 2/1987 | Burgess | 156/630 |
| 4,685,033 A | 8/1987 | Inoue | 361/414 |
| 4,706,167 A | 11/1987 | Sullivan | 361/406 |
| 4,716,049 A | 12/1987 | Patraw | 427/96 |
| 4,786,952 A | 11/1988 | MacIver et al. | 357/23.4 |
| 4,806,188 A | 2/1989 | Rellick | 156/89 |
| 4,811,082 A | 3/1989 | Jacobs et al. | 357/80 |
| 4,897,338 A | 1/1990 | Spicciati et al. | 430/314 |
| 4,905,124 A | 2/1990 | Banjo et al. | 361/395 |
| 4,915,983 A | 4/1990 | Lake et al. | 430/314 |
| 4,964,212 A | 10/1990 | Deroux-Dauphin et al. | 29/852 |
| 4,974,120 A | 11/1990 | Kodai et al. | 361/392 |
| 4,996,391 A | 2/1991 | Schmidt | 174/255 |
| 5,021,047 A | 6/1991 | Movern | 604/110 |
| 5,053,357 A | 10/1991 | Lin et al. | 437/204 |
| 5,072,075 A | 12/1991 | Lee et al. | 174/264 |
| 5,081,520 A | 1/1992 | Yoshii et al. | 357/80 |
| 5,108,553 A | 4/1992 | Foster et al. | 205/125 |
| 5,110,664 A | 5/1992 | Nakanishi et al. | 428/195 |
| 5,191,174 A | 3/1993 | Chang et al. | 174/266 |
| 5,229,550 A | 7/1993 | Bindra et al. | 174/262 |
| 5,239,448 A | 8/1993 | Perkins et al. | 361/764 |
| 5,247,429 A | 9/1993 | Iwase et al. | 362/29 |
| 5,263,243 A | 11/1993 | Taneda et al. | 29/830 |
| 5,283,459 A | 2/1994 | Hirano et al. | 257/419 |
| 5,371,654 A | 12/1994 | Beaman et al. | 361/744 |
| 5,379,191 A | 1/1995 | Carey et al. | 361/777 |
| 5,404,044 A | 4/1995 | Booth et al. | 257/698 |
| 5,440,805 A | 8/1995 | Daigle et al. | 29/830 |
| 5,463,253 A | 10/1995 | Waki et al. | 257/724 |
| 5,474,957 A | 12/1995 | Urushima | 437/209 |
| 5,474,958 A | 12/1995 | Djennas et al. | 437/211 |
| 5,508,938 A | 4/1996 | Wheeler | 364/488 |
| 5,530,288 A | 6/1996 | Stone | 257/700 |
| 5,531,020 A | 7/1996 | Durand et al. | 29/840 |
| 5,574,309 A | 11/1996 | Papapietro et al. | 257/679 |
| 5,581,498 A | 12/1996 | Ludwig et al. | 365/63 |
| 5,582,858 A | 12/1996 | Adamopoulos et al. | 427/96 |
| 5,616,422 A | 4/1997 | Ballard et al. | 428/621 |
| 5,637,832 A | 6/1997 | Danner | 174/260 |
| 5,674,785 A | 10/1997 | Akram et al. | 437/217 |
| 5,719,749 A | 2/1998 | Stopperan | 361/769 |
| 5,739,579 A | 4/1998 | Chiang et al. | 257/635 |
| 5,739,581 A | 4/1998 | Chillara | 257/668 |
| 5,739,585 A | 4/1998 | Akram et al. | 257/698 |
| 5,739,588 A | 4/1998 | Ishida et al. | 257/782 |
| 5,742,479 A | 4/1998 | Asakura | 361/737 |
| 5,774,340 A | 6/1998 | Chang et al. | 361/771 |
| 5,784,259 A | 7/1998 | Asakura | 361/752 |
| 5,798,014 A | 8/1998 | Weber | 156/263 |
| 5,822,190 A | 10/1998 | Iwasaki | 361/737 |
| 5,826,330 A | 10/1998 | Isoda et al. | 29/852 |
| 5,835,355 A | 11/1998 | Dordi | 361/760 |
| 5,847,453 A | 12/1998 | Uematsu et al. | 257/728 |
| 5,894,108 A | 4/1999 | Mostafazadeh et al. | 174/52.4 |
| 5,903,052 A | 5/1999 | Chen et al. | 257/706 |
| 5,936,843 A | 8/1999 | Ohshima et al. | 361/395 |
| 5,952,611 A | 9/1999 | Eng et al. | 174/52.4 |
| 5,990,546 A | 11/1999 | Igarashi et al. | 257/700 |
| 6,004,619 A | 12/1999 | Dippon et al. | 427/97 |
| 6,013,948 A | 1/2000 | Akram et al. | 257/698 |
| 6,021,564 A | 2/2000 | Hanson | 29/852 |
| 6,028,364 A | 2/2000 | Ogino et al. | 257/778 |
| 6,034,427 A | 3/2000 | Lan et al. | 257/698 |
| 6,035,527 A | 3/2000 | Tamm | |
| 6,039,889 A | 3/2000 | Zhang et al. | |
| 6,040,622 A | 3/2000 | Wallace | 257/679 |
| 6,060,778 A | 5/2000 | Jeong et al. | 257/710 |
| 6,069,407 A | 5/2000 | Hamzehdoost | 257/774 |
| 6,072,243 A | 6/2000 | Nakanishi | 257/783 |
| 6,081,036 A | 6/2000 | Hirano et al. | 257/773 |
| 6,115,910 A | 9/2000 | Ghahghahi | 29/833 |
| 6,119,338 A | 9/2000 | Wang et al. | 29/852 |
| 6,122,171 A | 9/2000 | Akram et al. | 361/704 |
| 6,127,250 A | 10/2000 | Sylvester et al. | 438/584 |
| 6,127,833 A | 10/2000 | Wu et al. | 324/755 |
| 6,160,705 A | 12/2000 | Stearns et al. | 361/704 |
| 6,162,365 A | 12/2000 | Bhatt et al. | 216/13 |
| 6,172,419 B1 | 1/2001 | Kinsman | 257/737 |
| 6,175,087 B1 | 1/2001 | Keesler et al. | 174/261 |
| 6,184,463 B1 | 2/2001 | Panchou et al. | 174/52.4 |
| 6,194,250 B1 | 2/2001 | Melton et al. | |
| 6,204,453 B1 | 3/2001 | Fallon et al. | 174/255 |
| 6,214,641 B1 | 4/2001 | Akram | 438/107 |
| 6,235,554 B1 | 5/2001 | Akram et al. | 438/109 |
| 6,239,485 B1 | 5/2001 | Peters et al. | 257/700 |
| D445,096 S | 7/2001 | Wallace | D14/117 |
| D446,525 S | 8/2001 | Okamoto et al. | D14/436 |
| 6,274,821 B1 | 8/2001 | Echigo et al. | 174/255 |
| 6,280,641 B1 | 8/2001 | Gaku et al. | 216/17 |
| 6,316,285 B1 | 11/2001 | Jiang et al. | 438/106 |
| 6,351,031 B1 | 2/2002 | Iijima et al. | 257/698 |
| 6,352,914 B2 | 3/2002 | Ball et al. | 438/599 |
| 6,353,999 B1 | 3/2002 | Cheng | 29/852 |
| 6,365,975 B1 | 4/2002 | DiStefano et al. | 257/777 |
| 6,368,967 B1 | 4/2002 | Besser | 438/687 |
| 6,376,906 B1 | 4/2002 | Asai et al. | 257/698 |
| 6,378,201 B1 | 4/2002 | Tsukada et al. | 29/852 |
| 6,392,160 B1 | 5/2002 | Andry et al. | 174/261 |
| 6,395,578 B1 | 5/2002 | Shin et al. | 438/106 |
| 6,405,431 B1 | 6/2002 | Shin et al. | 29/852 |
| 6,406,942 B2 | 6/2002 | Honda | 438/119 |
| 6,407,341 B1 | 6/2002 | Anstrom et al. | 174/255 |
| 6,407,930 B1 | 6/2002 | Hsu | 361/784 |
| 6,418,615 B1 | 7/2002 | Rokugawa et al. | 29/852 |
| 6,426,550 B2 | 7/2002 | Ball et al. | 257/700 |
| 6,451,509 B2 | 9/2002 | Keesler et al. | 430/311 |
| 6,472,306 B1 | 10/2002 | Lee et al. | 438/623 |
| 6,479,762 B2 | 11/2002 | Kusaka | 174/261 |
| 6,497,943 B1 | 12/2002 | Jimarez et al. | 428/209 |
| 6,502,774 B1 | 1/2003 | Johansson et al. | 241/37 |
| 6,517,995 B1 | 2/2003 | Jacobson et al. | 430/320 |
| 6,534,391 B1 | 3/2003 | Huemoeller et al. | 438/612 |
| 6,534,723 B1 | 3/2003 | Asai et al. | 174/255 |
| 6,544,638 B2 | 4/2003 | Fischer et al. | 428/322.7 |
| 6,570,258 B2 | 5/2003 | Ma et al. | 257/774 |
| 6,574,106 B2 | 6/2003 | Mori | 361/705 |
| 6,586,682 B2 | 7/2003 | Strandberg | 174/255 |
| 6,608,757 B1 | 8/2003 | Bhatt et al. | 361/748 |
| 6,637,105 B1 | 10/2003 | Watanabe et al. | 29/852 |
| 6,660,559 B1 | 12/2003 | Huemoeller et al. | 438/106 |
| 6,715,204 B1 | 4/2004 | Tsukada et al. | 29/847 |
| 6,727,645 B2 | 4/2004 | Tsujimura et al. | 313/504 |
| 6,730,857 B2 | 5/2004 | Konrad et al. | 174/257 |
| 6,740,964 B2 | 5/2004 | Sasaki | |
| 6,753,612 B2 | 6/2004 | Adae-Amoakoh et al. | 257/774 |
| 6,787,443 B1 | 9/2004 | Boggs et al. | 438/612 |
| 6,803,528 B1 | 10/2004 | Koyanagi | 174/262 |
| 6,804,881 B1 | 10/2004 | Shipley et al. | 29/830 |
| 6,815,709 B2 | 11/2004 | Clothier et al. | 257/40 |
| 6,815,739 B2 | 11/2004 | Huff et al. | 257/275 |
| 6,822,334 B2 | 11/2004 | Hori et al. | 257/775 |
| 6,891,261 B2 | 5/2005 | Awaya | 257/692 |
| 6,908,863 B2 | 6/2005 | Barns et al. | |
| 6,913,952 B2 | 7/2005 | Moxham et al. | 438/125 |
| 6,919,514 B2 | 7/2005 | Konrad et al. | |
| 6,930,256 B1 | 8/2005 | Huemoeller et al. | 174/260 |
| 6,930,257 B1 | 8/2005 | Hiner et al. | 174/262 |
| 6,940,170 B2 | 9/2005 | Parikh | 257/750 |
| 6,989,593 B2 | 1/2006 | Khan et al. | 257/707 |

| | | |
|---|---|---|
| 6,998,335 B2 | 2/2006 | Fan et al. .................... 438/612 |
| 7,028,400 B1 | 4/2006 | Hiner et al. ................... 29/852 |
| 7,033,928 B2 | 4/2006 | Kawano .................... 438/637 |
| 7,061,095 B2 | 6/2006 | Boggs et al. |
| 7,145,238 B1 | 12/2006 | Huemoeller et al. ........ 257/750 |
| 7,214,609 B2 | 5/2007 | Jiang et al. ................. 438/637 |
| 7,242,081 B1 | 7/2007 | Lee |
| 7,297,562 B1 | 11/2007 | Huemoeller et al. .......... 438/15 |
| 7,345,361 B2 | 3/2008 | Mallik et al. |
| 7,372,151 B1 | 5/2008 | Fan et al. |
| 7,435,352 B2 * | 10/2008 | Mok et al. .................... 216/13 |
| 2001/0041436 A1 | 11/2001 | Parikh |
| 2002/0017712 A1 | 2/2002 | Bessho et al. ................ 257/700 |
| 2003/0000738 A1 | 1/2003 | Rumsey et al. .............. 174/260 |
| 2003/0128096 A1 | 7/2003 | Mazzochette ................ 338/22 |
| 2005/0194353 A1 | 9/2005 | Johnson et al. ............... 216/65 |
| 2005/0205295 A1 | 9/2005 | Tsuk |
| 2006/0157854 A1 | 7/2006 | Takewaki et al. |
| 2007/0114203 A1 | 5/2007 | Kang |
| 2007/0273049 A1 | 11/2007 | Khan et al. |
| 2007/0290376 A1 | 12/2007 | Zhao et al. |
| 2008/0230887 A1 | 9/2008 | Sun et al. |

OTHER PUBLICATIONS

Huemoeller et al., "Integral Plated Semiconductor Package Substrate Stiffener", U.S. Appl. No. 11/189,593, filed Jul. 26, 2005.

Hiner et al., "Extended Landing Pad Substrate Package Structure and Method", U.S. Appl. No. 12/351,596, filed Jan. 9, 2009.

Berry et al., "Thin Stacked Interposer Package", U.S. Appl. No. 11/865,617, filed Oct. 1, 2007.

Scanlan, "Package-on-package (PoP) with Through-mold Vias", *Advanced Packaging*, Jan. 2008, 3 pages, vol. 17, Issue 1, PennWell Corportation.

Kim et al., "Application of Through Mold Via (TMV) as PoP base package", *58th ECTC Proceedings*, May 2008, Lake Buena Vista, FL, 6 pages, IEEE.

Huemoeller et al., U.S. Appl. No. 12/151,857, filed May 9, 2008, entitled "Multi-Level Circuit Substrate and Fabrication Method".

Huemoeller et al., "Method and Structure for Creating Embedded Metal Features", U.S. Appl. No. 12/462,665, filed on Aug. 5, 2009.

IBM Technical Disclosure Bulletin, "Microstructure Solder Mask by Means of a Laser", vol. 36, Issue 11, p. 589, Nov. 1, 1993. (NN9311589).

Wolf et al., "Silicon Processing for the VLSI Era: vol. 1- Process Technology", 1986, pp. 407-408.

Huemoeller et al., U.S. Appl. No. 10/947,124, filed Sep. 22, 2004, entitled "Method for Making an Integrated Circuit Substrate Having Embedded Back-Side Access Conductors and Vias".

Huemoeller et al., U.S. Appl. No. 11/045,402, filed Jan. 28, 2005, entitled "Method for Making a Semiconductor Package Substrate Having a Printed Circuit Pattern Atop and Within a Dielectric".

Hiner et al., U.S. Appl. No. 11/098,995, filed Apr. 5, 2005, entitled "Method for Making an Integrated Circuit Substrate Having Laminated Laser-Embedded Circuit Layers".

Huemoeller et al., U.S. Appl. No. 11/527,827, filed Sep. 26, 2006, entitled "Semiconductor Package and Substrate Having Multi-Level Vias Fabrication Method".

Huemoeller et al., U.S. Appl. No. 11/543,540, filed Oct. 4, 2006, entitled "Method and Structure for Creating Embedded Metal Features".

Rusli et al., U.S. Appl. No. 11/621,402, filed Jan. 9, 2007, entitled "Embedded Circuit Pattern Fabrication Method and Structure".

Huemoeller et al., U.S. Appl. No. 11/982,637, filed Nov. 1, 2007, entitled "Circuit-On-Foil Process for Manufacturing a Laminated Semiconductor Package Substrate Having Embedded Conductive Patterns".

\* cited by examiner

SUBSTRATE HAVING STIFFENER FABRICATION METHOD

CROSS-REFERENCE TO RELATED APPLICATIONS

The present application is a divisional of U.S. Patent Application entitled "INTEGRAL PLATED SEMICONDUCTOR PACKAGE SUBSTRATE STIFFENER", Ser. No. 11/189,593, filed on Jul. 26, 2005, which is a continuation-in-part of U.S. Patent Application entitled "CIRCUIT-ON-FOIL PROCESS FOR MANUFACTURING A LAMINATED SEMICONDUCTOR PACKAGE SUBSTRATE HAVING EMBEDDED CONDUCTIVE PATTERNS", Ser. No. 11/166,005 filed Jun. 24, 2005.

The above-referenced parent application, Ser. No. 11/166,005, is a continuation-in-part of U.S. Patent application entitled "INTEGRATED CIRCUIT SUBSTRATE HAVING LASER-EMBEDDED CONDUCTIVE PATTERNS AND METHOD THEREFOR", Ser. No. 10/138,225 filed May 1, 2002, now U.S. Pat. No. 6,930,256, issued Aug. 16, 2005, and is also a continuation-in-part of U.S. Patent application entitled "SEMICONDUCTOR PACKAGE SUBSTRATE HAVING A PRINTED CIRCUIT PATTERN ATOP AND WITHIN A DIELECTRIC AND A METHOD FOR MAKING A SUBSTRATE", Ser. No. 11/045,402 filed Jan. 28, 2005, which is a continuation-in-part of U.S. patent application Ser. No. 10/138,225 filed May 1, 2002, now U.S. Pat. No. 6,930,256, issued Aug. 16, 2005, entitled "INTEGRATED CIRCUIT SUBSTRATE HAVING LASER-EMBEDDED CONDUCTIVE PATTERNS AND METHOD THEREFOR."

All of the above-referenced U.S. Patent Applications have at least one common inventor and are assigned to the same assignee as this application. The specifications of the above-referenced patent applications are herein incorporated by reference.

FIELD OF THE INVENTION

The present invention relates generally to semiconductor packaging, and more specifically, to a semiconductor package substrate having an integral plated stiffener that is produced during the substrate fabrication process.

BACKGROUND OF THE INVENTION

Semiconductors and other electronic and opto-electronic assemblies are fabricated in groups on a wafer. Known as "dies", the individual devices are cut from the wafer and are then bonded to a carrier. The dies must be mechanically mounted and electrically connected to a circuit. For this purpose, many types of packaging have been developed, including "flip-chip", ball grid array (BGA) and leaded grid array (LGA) among other mounting configurations. These configurations typically use a planar printed circuit etched on the substrate with bonding pads and the connections to the die are made by either wire bonding or direct solder connection to the die.

As the overall semiconductor package height is decreased, the thickness of the substrate has likewise been decreased and typical substrates for BGA/LGA packages today are thin film circuits fabricated on KAPTON or other film material, so that the substrates are thin, but with sufficient strength and thermal stability to handle the thermal cycles and handling during the manufacturing process. However, the application of thin films as substrates have led to the need for a stiffener that supports the substrate during the manufacturing process so that the substrate is maintained in proper shape during encapsulation or other final packaging steps.

Typical stiffeners are pre-formed metal strips or rings that are bonded onto the surface of the substrate film after etching/plating of the interconnect circuit patterns and any laminating of multiple substrate layers. Since the stiffeners are added in a separate process after circuit formation, clearances between the stiffener and features of the substrate must be carefully maintained during the bonding process and are generally limited to the periphery of the substrate outside of circuit pattern, wafer bonding, and semiconductor package terminal areas.

SUMMARY OF THE INVENTION

A semiconductor package substrate having an integral plated stiffener and a process for forming the stiffener on the substrate generate a metal stiffener structure of arbitrary shape on one or both sides of the substrate by plating. A metal film layer that covers a dielectric layer of the substrate is plated up in areas to form the stiffener and then exposed portions are removed via etching. The resulting stiffener is a two-level metal structure that may be of differing metals in each level.

The outer metal layer can be made by using a plating resist material that is then laser-ablated or patterned via a photo-lithographic process, yielding a negative stiffener image. The regions between the ablated resist are filled by plating up metal and the resist is removed to yield the stiffener.

The outer metal layer is generally much thicker than the metal film layer, and while the metal film layer will generally be copper from which circuit patterns are formed either within or atop the dielectric layer, the outer metal can be made of a much harder material for stiffness, such as brass or other copper alloy.

BRIEF DESCRIPTION OF THE DRAWINGS

The invention, as well as a preferred mode of use and advantages thereof, will best be understood by reference to the following detailed description of illustrative embodiments when read in conjunction with the accompanying drawings, wherein like reference numerals indicate like parts throughout.

DETAILED DESCRIPTION

The present invention concerns a process for making a semiconductor package substrate having an integral plated stiffener. A metal structure is built up on one or both surfaces of the substrate by plating up a metal that may be the same as the metal used to form interconnect surface patterns, may be an alloy of the circuit pattern metal or may be a differing metal. The stiffener is provided to aid in maintaining planarity of the substrate during the manufacturing process, and will also enhance the stiffness of the final semiconductor package, which may or may not be encapsulated.

The stiffener may be fabricated in conjunction with processes and structures such as those described in the above-incorporated parent U.S. Patent Application, in which a semi-additive process is used to form a plated metal-on-foil structure above a preexisting metal foil. Alternatively, the stiffener may be fabricated in conjunction with the seed plating techniques used in the laser embedded circuit pattern substrates described in the above-incorporated grandparent U.S. Patent Applications.

Figure 1A:
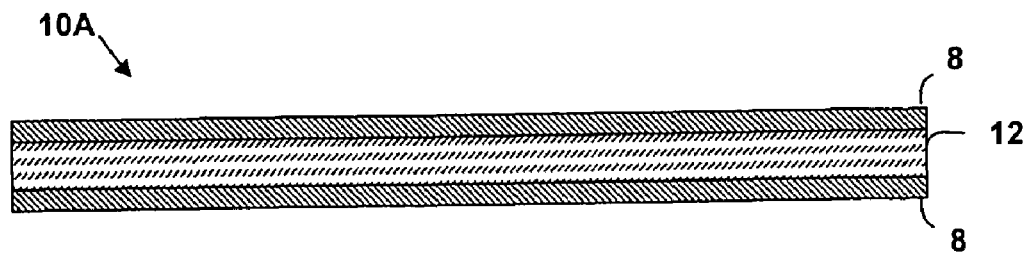
FIGS. 1A-1N are pictorial diagrams depicting cross-sectional views of various stages in the preparation of a substrate in accordance with an embodiment of the present invention.
Figure 1B:
Figure 1C:
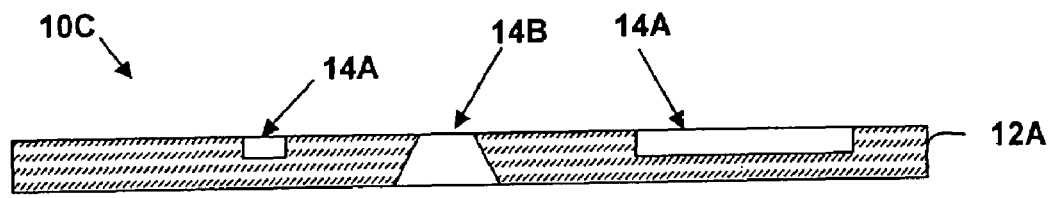
Figure 1D:
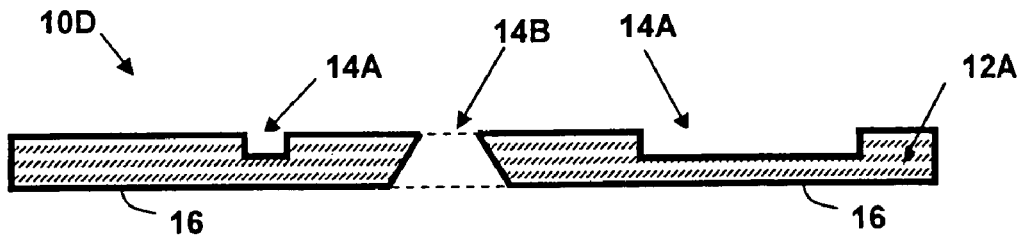
Figure 1E:
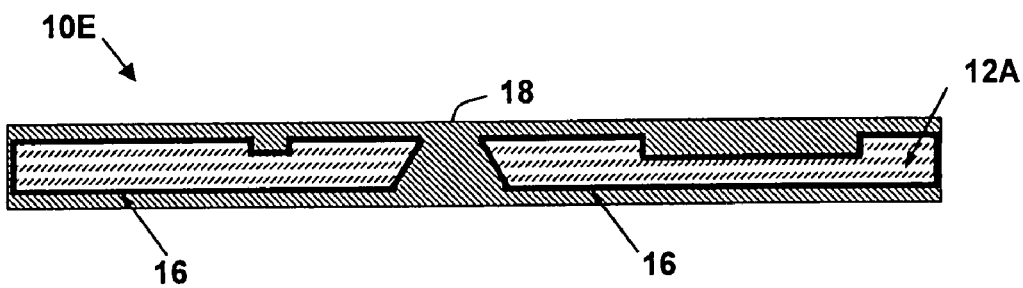
Figure 1F:
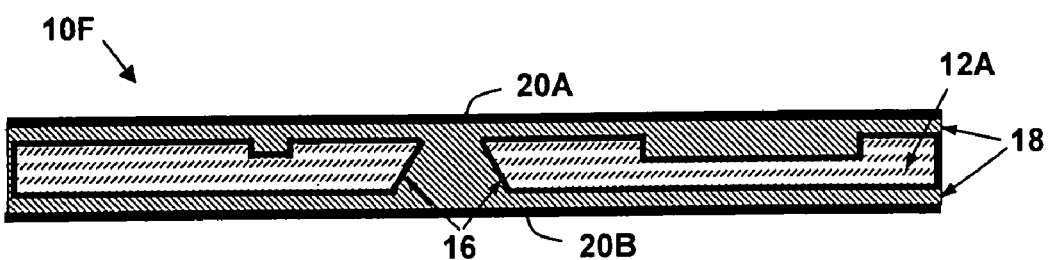
Figure 1G:
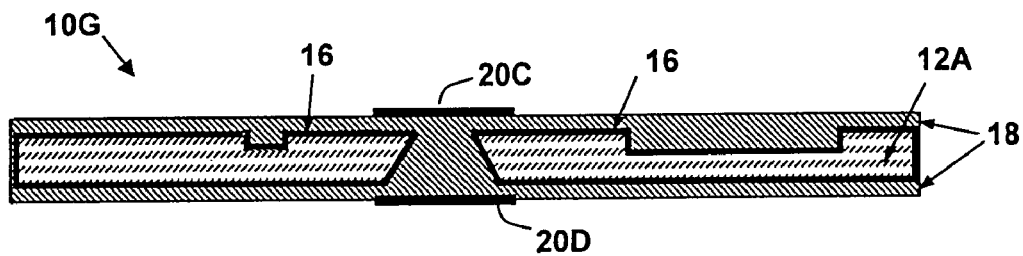
Figure 1H:
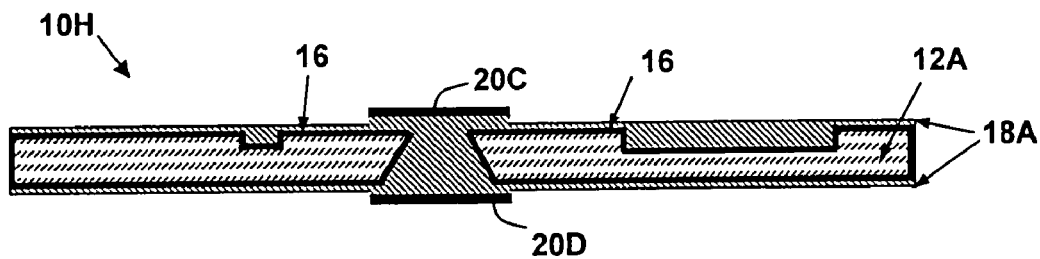
Figure 1I:
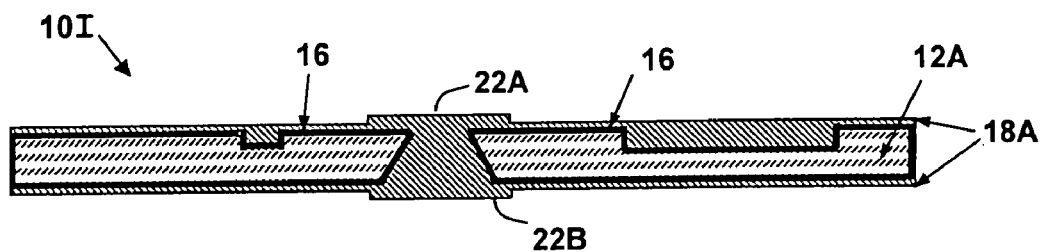
Figure 1J:
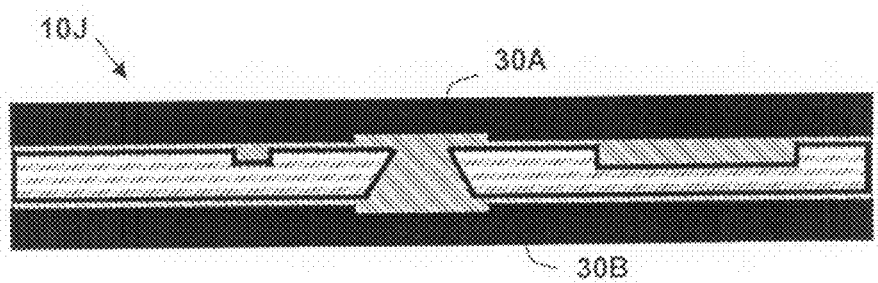
Figure 1K:
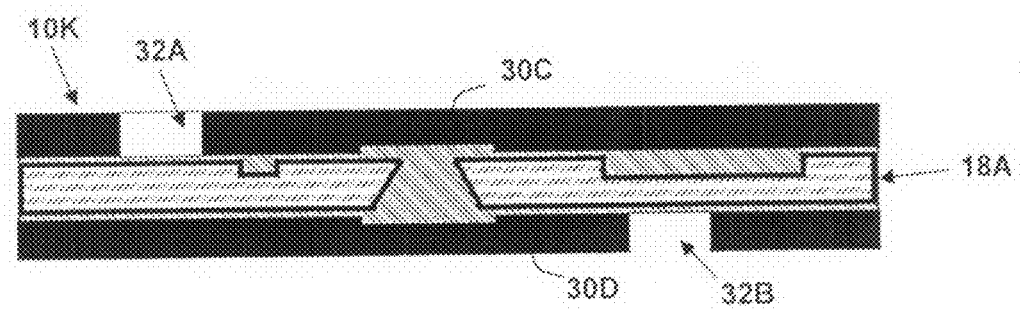
Figure 1L:
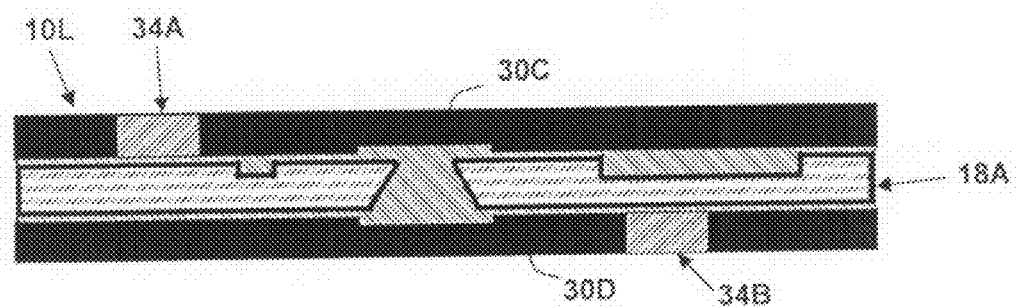
Figure 1M:
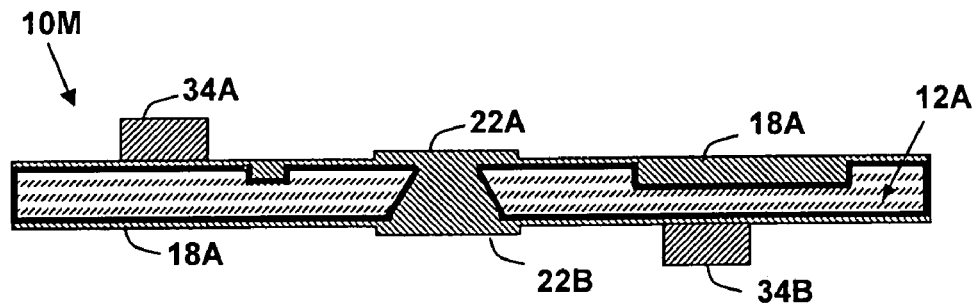
Figure 1N:
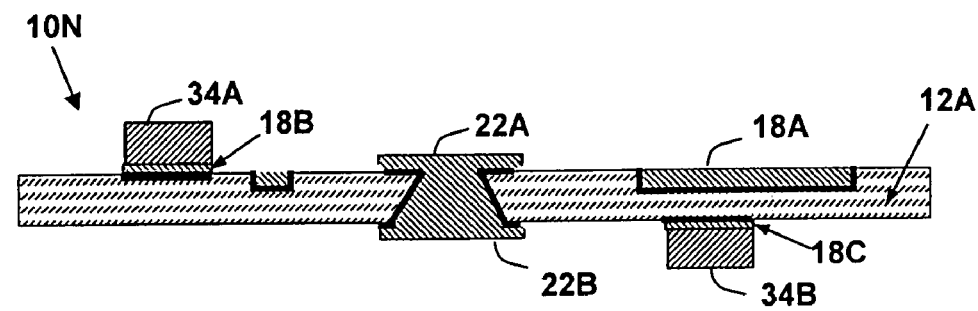

Referring now to the figures and in particular to FIGS. 1A-1N, cross-sectional views illustrate a substrate manufacturing process in accordance with an embodiment of the present invention. FIG. 1A shows a clad dielectric laminate 10A, as is commonly used for forming patterned circuit substrates via an etching process. Laminate 10A includes a copper film layer 8 bonded to each side of a dielectric sheet 12. In the present invention, laminate 10A is used to provide only dielectric sheet 12 and as shown in FIG. 1B, copper film layer 8 is removed from each side of dielectric sheet 12 via an etching process to yield a very uniform substrate form 10B comprising denuded dielectric sheet 12.

Next, dielectric sheet 12 is laser-ablated to form channels 14A and cavities/thru-vias 14B for various features that will be embedded as circuit patterns or vias, yielding modified dielectric sheet 12A of substrate step 10C. Then, a seed plating 16 (generally copper) is applied via an electro-less process to coat dielectric sheet 12A, forming substrate step 10D of FIG. 1D. After seed plating, a thicker layer of metal is plated up on each side of substrate step 10D via a controlled plating process that yields a very planar coating of metal 18 (generally copper again) on each side of a substrate step 10E as shown in FIG. 1E.

As shown in FIG. 1F, a substrate step 10F is provided by coating both sides of substrate step 10E with an etch resist material 20A, 20B. Etch resist material 20A, 20B is generally photosensitive and is imaged to leave resist material 20C, 20D as shown in substrate step 10G of FIG. 1G for the formation of ball-grid array (BGA) lands and semiconductor die interconnect terminals. Next, as shown in FIG. 1H, substrate step 10H is formed by etching metal 18 to leave only a thin metal layer 18A, except in the regions still covered by etch resist material 20C, 20D. Then etch resist material 20C, 20D is removed to expose BGA land areas 22A, 22B.

Now, as shown in FIG. 1J, the formation of the stiffener on one or both sides of substrate 10I is commenced by coating each side of substrate step 10J with a plating resist material 30A, 30B. Then plating resist 30A, 30B is laser-ablated in the desired stiffener shape to form voids 32A, 32B, which are generally channels running parallel to the surfaces of substrate step 10K as shown in FIG. 1K. The shape of the stiffener is therefore arbitrary and is constrained only by the stiffener requirements and the areas of the substrate that must be avoided (such as BGA land areas and the circuit channels exposed at the surface). The precision with which the stiffener is plated (rather than placed) makes it possible to locate the stiffener very close to circuit features without making electrical contact.

A stiffener 34A, 34B is formed as shown in substrate step 10L of FIG. 1L, by plating a metal within voids 32A, 32B in plating resist material 30C, 30D using an electroplating process that uses metal layer 18A as an electrode. The plated metal may be the same or may differ. In general, copper is used for metal layer 18A, as conductive patterns are formed from the same metal and stiffener 34A, 34B is formed from a plating-compatible metal or alloy that is less ductile, such as Nickel or Tin, or a copper alloy such as Brass. After formation of stiffener 34A, 34B, remaining plating resist material 30C, 30D is removed to form substrate step 10M of FIG. 1M.

Finally, a controlled etching process is used to remove the remaining excess metal 18A and the seed layer 16, leaving only the circuit pattern metal 18A (and seed layer 16) previously deposited within circuit pattern channels and the metal 18B, 18C and seed layer that connect stiffener portions 34A, 34B to the dielectric layer 12A as shown in the resulting substrate 10N. As such, two or three distinct crystalline structures of a single metal, or two distinct structures of the first metal (e.g., Copper) and a distinct structure of stiffener portions 34A, 34B can be observed in substrate 10N via microscopy or other metallurgic examination techniques.

While the illustrative embodiment shows a stiffener formed on both sides of a substrate, it should be understood that the present invention provides for plated stiffeners on one or both sides of the substrate, and that the composition of the metals is not a limitation as pointed out above. The shape of the stiffener can be arbitrary, or can be patterned to form traditional shapes such as a boundary ring and the stiffener can further be used for attachment of a metal lid.

Figure 2A:
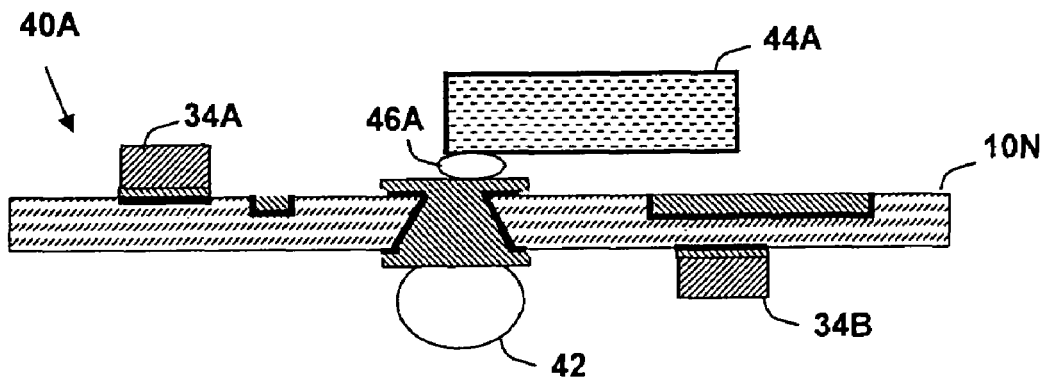
FIGS. 2A and 2B are pictorial diagrams depicting semiconductor packages in accordance with embodiments of the present invention.

FIG. 2A shows a semiconductor package 40A in accordance with an embodiment of the present invention. A semiconductor die 44A is attached to substrate 10N by flip-chip terminals 46A or posts. Solder balls 42 are added to provide a mechanism for attaching semiconductor package 40A to external devices. The resulting package 40A may be encapsulated and a plating step can be optionally applied to terminal mounting areas prior to attachment of terminals 46A and solder balls 42.

While die 44A is depicted as mounted above substrate 10N, a die mounting recess may also be laser-ablated or otherwise provided in substrate 10N, reducing the package height.

Figure 2B:
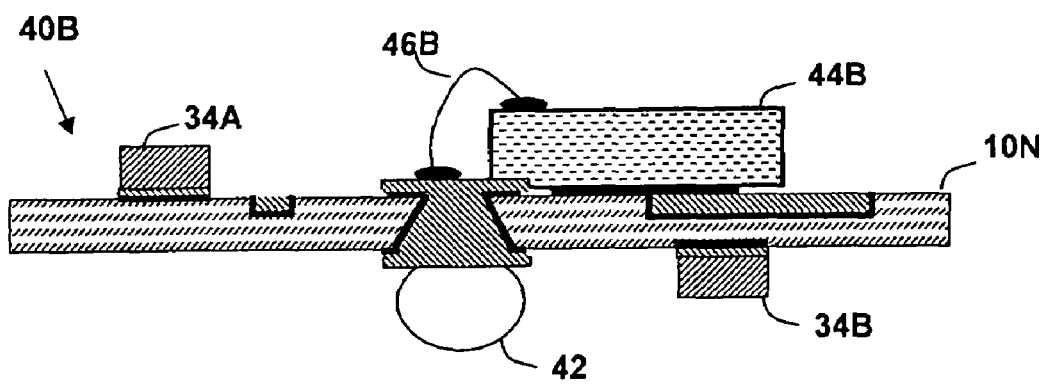

FIG. 2B shows a semiconductor package 40B in accordance with an embodiment of the present invention. A semiconductor die 44B is attached to substrate 10N by bond wires 46B. Solder balls 42 are added to provide a mechanism for attaching semiconductor package 40B to external devices. The resulting package 40B may be encapsulated and a plating step can be optionally applied to-wire bond and-terminal mounting areas prior to attachment of wire 46B and solder balls 42. While die 44B depicted as mounted above substrate 10N, a die mounting recess may also be laser-ablated or otherwise provided in substrate 10N, reducing the package height.

Figure 3:
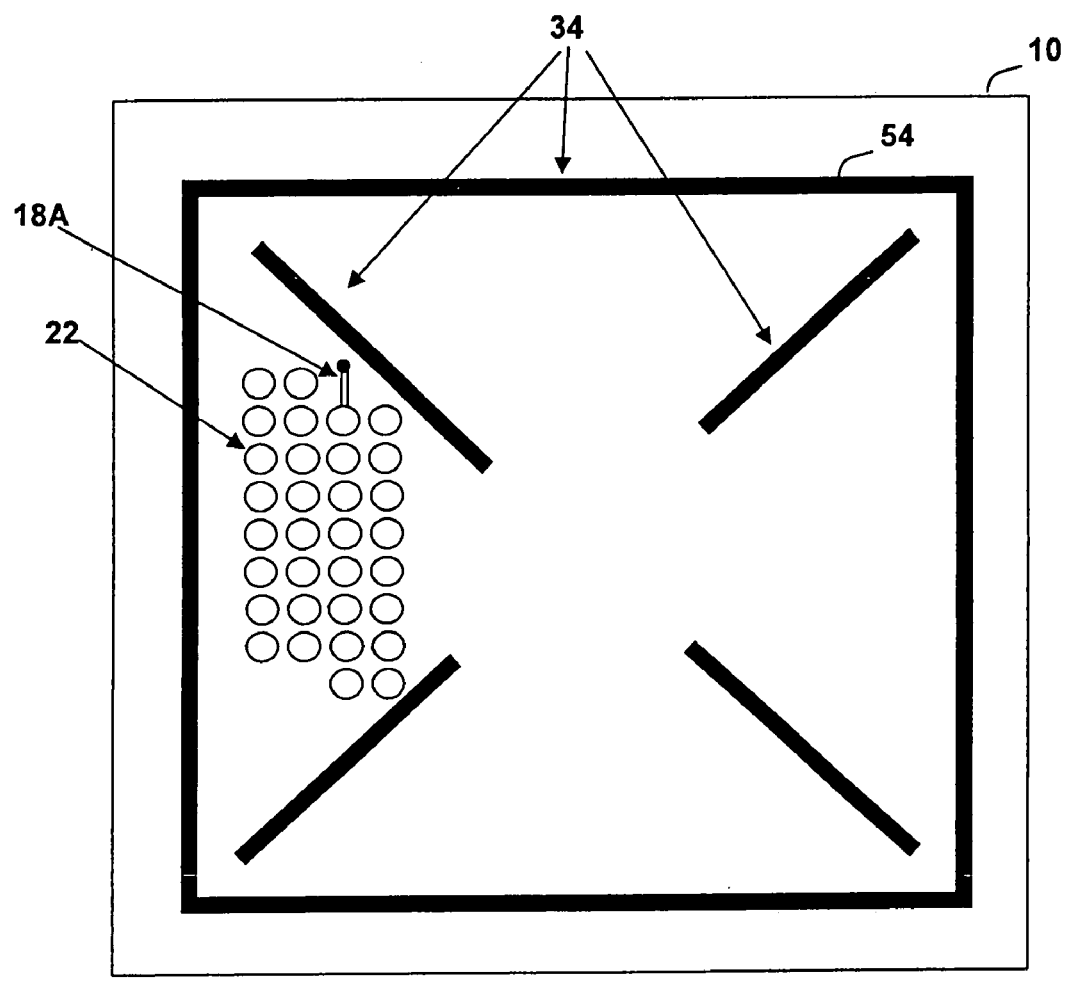
FIG. 3 is a pictorial diagram depicting a plan view of a substrate including a stiffener in accordance with an embodiment of the present invention.

Referring now to FIG. 3, a plan view of a substrate 10 including a plated stiffener 34 in accordance with an embodiment of the invention is depicted. As is shown, portions of stiffener can be located in the interconnect metal 18A and terminal 22 areas of substrate 10 without shorting. A ring-shaped portion of stiffener 54 can provide for solder or welding attachment of a lid to the final semiconductor package.

The above description of embodiments of the invention is intended to be illustrative and not limiting. Other embodiments of this invention will be obvious to those skilled in the art in view of the above disclosure and fall within the scope of the present invention.

What is claimed is:

1. A method of making a substrate for a semiconductor package, the method comprising:
providing a substrate form comprising a substantially planar thin foil metal layer bonded to a dielectric layer;
applying a plating resist material to a surface of the thin foil metal layer;

laser-ablating the plating resist material to form a plating resist structure defining voids in a shape of a stiffener for the substrate; and plating an outer metal layer within the voids to form the stiffener atop a first surface of the planar thin foil metal layer.

2. The method of claim 1, further comprising etching the thin foil metal layer to leave only regions corresponding to the stiffener.

3. The method of claim 2, wherein the providing a substrate form provides the substantially planar thin foil metal layer that has extensions into the dielectric layer filling channels extending within the dielectric layer in a plane parallel to primary surfaces of the dielectric layer, and wherein the etching separates the extensions of the thin foil metal layer to form a circuit pattern within the channels within the dielectric layer.

4. A method of making a substrate for a semiconductor package, the method comprising:

forming a metal layer over a first surface of a dielectric layer;

forming a plating resist material on the metal layer;

laser-ablating the plating resist material to form voids in the plating resist material; and plating an outer metal layer using the metal layer as an electrode within the voids to form a stiffener.

5. The method of claim 4 further comprising forming a seed layer on the dielectric layer.

6. The method of claim 5 wherein the metal layer is plated atop the seed layer.

7. The method of claim 4 further comprising:

forming an etch resist material on the metal layer;

patterning the etch resist material to remove the etch resist material except where lands and terminals are to be formed.

8. The method of claim 7 further comprising etching the metal layer except in regions covered by the etch resist material.

9. The method of claim 8 further comprising removing the etch resist material to expose the lands and terminals.

10. The method of claim 4 wherein the voids comprise channels parallel to the first surface of the dielectric layer.

11. The method of claim 4 wherein the outer metal layer is selected from the group consisting of nickel, tin, copper, a copper alloy, and brass.

12. The method of claim 4 further comprising:

forming another metal layer over a second surface of the dielectric layer;

forming another plating resist material on the another metal layer;

laser-ablating the another plating resist material to form voids in the another plating resist material; and plating another outer metal layer using the another metal layer as an electrode within the voids of the another plating resist material to form another stiffener.

13. A method of making a substrate for a semiconductor package, the method comprising:

laser-ablating a dielectric layer to form channels and via apertures in the dielectric layer;

forming a seed layer on the dielectric layer;

forming a metal layer on the seed layer, wherein the seed layer and metal layer fill the channels and via apertures;

forming an etch resist material on the metal layer;

patterning the etch resist material to remove the etch resist material except where lands and terminals are to be formed;

etching the metal layer except in regions covered by the etch resist material;

removing the etch resist material to expose the lands and terminals;

forming a plating resist material on the metal layer;

laser-ablating the plating resist material to form voids in the plating resist material; and plating an outer metal layer using the metal layer as an electrode within the voids to form stiffeners on both sides of the substrate.

14. The method of claim 13 further comprising removing the plating resist material.

15. The method of claim 14 further comprising etching the metal layer and the seed layer to form a circuit pattern within the channels and via apertures.

16. The method of claim 15 wherein after the etching the metal layer and the seed layer, portions of the metal layer and seed layer remain within the channels and via apertures, the portions forming the circuit pattern.

17. The method of claim 15 wherein after the etching the metal layer and the seed layer, portions of the metal layer and the seed layer connect the outer metal layer to the dielectric layer.

18. The method of claim 17 wherein the stiffeners comprise:

the portions of the seed layer on first and second surfaces of the dielectric layer;

the portions of the metal layer on the portions of the seed layer; and the outer metal layer on the portions of the metal layer.

19. The method of claim 18 wherein the stiffeners comprise three distinct crystalline structures.

20. The method of claim 13 wherein the stiffeners are ring shaped.

21. A method of making a substrate for a semiconductor package, the method comprising:

laser-ablating a dielectric layer to form channels and via apertures in the dielectric layer;

forming a seed layer on the dielectric layer;

forming a metal layer on the seed layer, wherein the seed layer and metal layer fill the channels and via apertures;

forming an etch resist material on the metal layer;

patterning the etch resist material to remove the etch resist material except where lands and terminals are to be formed;

etching the metal layer except in regions covered by the etch resist material;

removing the etch resist material to expose the lands and terminals;

forming a plating resist material on the metal layer;

laser-ablating the plating resist material to form voids in the plating resist material; and plating an outer metal layer using the metal layer as an electrode within the voids to form a stiffener on the substrate.

22. The method of claim 21 further comprising:

removing the plating resist material; and etching the metal layer and the seed layer such that portions of the metal layer and the seed layer connect the outer metal layer to the dielectric layer.

23. The method of claim 22 wherein the stiffener comprises:

the portions of the seed layer on the dielectric layer;

the portions of the metal layer on the portions of the seed layer; and the outer metal layer on the portions of the metal layer.

24. The method of claim 23 wherein the stiffener comprises three distinct crystalline structures.

25. A method of making a substrate for a semiconductor package, the method comprising:
   laser-ablating a dielectric layer to form channels and via apertures in the dielectric layer;
   forming a seed layer on the dielectric layer;
   forming a metal layer on the seed layer, wherein the seed layer and metal layer fill the channels and via apertures;
   forming an etch resist material on the metal layer;
   patterning the etch resist material to remove the etch resist material except where lands and terminals are to be formed;
   etching the metal layer except in regions covered by the etch resist material;
   removing the etch resist material to expose the lands and terminals;
   forming a plating resist material on the metal layer;
   laser-ablating the plating resist material to form voids in the plating resist material;
   plating an outer metal layer using the metal layer as an electrode within the voids to form a stiffener on the substrate;
   removing the plating resist material; and
   etching the metal layer and the seed layer such that portions of the metal layer and seed layer remain within the channels and via apertures, the portions forming a circuit pattern.

* * * * *